United States Patent
Cui et al.

(10) Patent No.: US 9,429,208 B2
(45) Date of Patent: Aug. 30, 2016

(54) VIBRATION ISOLATOR WITH ZERO STIFFNESS WHOSE ANGLE DEGREE OF FREEDOM IS DECOUPLED WITH SPHERICAL AIR BEARING

(71) Applicant: HARBIN INSTITUTE OF TECHNOLOGY, Harbin, Heilongjiang (CN)

(72) Inventors: Junning Cui, Heilongjiang (CN); Jiubin Tan, Heilongjiang (CN); Lei Wang, Heilongjiang (CN)

(73) Assignee: Harbin Institute of Technology, Harbin (CN)

( * ) Notice: Subject to any disclaimer, the term of this patent is extended or adjusted under 35 U.S.C. 154(b) by 0 days.

(21) Appl. No.: 14/421,378

(22) PCT Filed: Feb. 19, 2014

(86) PCT No.: PCT/CN2014/072278
§ 371 (c)(1),
(2) Date: Feb. 12, 2015

(87) PCT Pub. No.: WO2014/094688
PCT Pub. Date: Jun. 26, 2014

(65) Prior Publication Data
US 2015/0219179 A1    Aug. 6, 2015

(30) Foreign Application Priority Data

Dec. 19, 2012 (CN) .......................... 2012 1 0571692

(51) Int. Cl.
*F16M 13/00* (2006.01)
*F16F 15/03* (2006.01)
(Continued)

(52) U.S. Cl.
CPC .......... *F16F 15/03* (2013.01); *F16C 32/0614* (2013.01); *F16F 15/002* (2013.01);
(Continued)

(58) Field of Classification Search
CPC ... F16F 15/03; F16F 15/002; F15C 32/0614; G01B 7/003; G01D 5/20; G01L 19/00; H02K 41/0356; G03F 7/70833
USPC .................................. 248/550, 638, 644, 678
See application file for complete search history.

(56) References Cited

U.S. PATENT DOCUMENTS 5,573,088 A * 11/1996 Daniels .............. B60G 17/0157
                                                            188/267
5,844,664 A    12/1998 Van Kimmenade et al.
(Continued)

FOREIGN PATENT DOCUMENTS

CN            1803965 A2    7/2007
CN          103032515 A     4/2013
(Continued)

OTHER PUBLICATIONS

English Abstract of CN103062283.
(Continued)

*Primary Examiner* — Gwendolyn Baxter
(74) *Attorney, Agent, or Firm* — Ladas & Parry LLP

(57) ABSTRACT

A vibration isolator with zero stiffness whose angle degree of freedom is decoupled with a spherical air bearing has a main body, in which a sleeve and a lower mounting plate, a piston cylinder and the sleeve are both lubricated and supported with air bearing surfaces respectively, and the angle degree of freedom between a upper mounting plate and the lower mounting plate is decoupled with a spherical air bearing; a position close-loop control system comprising voice coil motors, displacement sensors, limit switches, a controller and a driver is introduced, and the relative position between the upper mounting plate and the lower mounting plate is precisely controlled.

6 Claims, 3 Drawing Sheets

(51) Int. Cl.
*F16C 32/06* (2006.01)
*F16F 15/00* (2006.01)
*G01B 7/00* (2006.01)
*G01D 5/20* (2006.01)
*G01L 19/00* (2006.01)
*H02K 41/035* (2006.01)
*G03F 7/20* (2006.01)

(52) U.S. Cl.
CPC ............... *G01B 7/003* (2013.01); *G01D 5/20* (2013.01); *G01L 19/00* (2013.01); *G03F 7/70833* (2013.01); *H02K 41/0356* (2013.01)

(56) References Cited

U.S. PATENT DOCUMENTS

| | | | |
|---|---|---|---|
| 6,144,442 A | 11/2000 | T Mannetje et al. | |
| 6,226,075 B1 | 5/2001 | Loopstra et al. | |
| 7,084,956 B2 | 8/2006 | Dams et al. | |
| 2004/0065517 A1 | 4/2004 | Watson et al. | |
| 2008/0193061 A1 | 8/2008 | Heiland | |
| 2010/0284638 A1* | 11/2010 | Hirata | F16C 32/067 384/100 |
| 2014/0374565 A1* | 12/2014 | Tan | F16F 15/023 248/542 |
| 2015/0219180 A1* | 8/2015 | Tan | F16F 15/03 248/550 |
| 2015/0260255 A1* | 9/2015 | Tan | F16F 15/0232 248/550 |

FOREIGN PATENT DOCUMENTS

| | | |
|---|---|---|
| CN | 103047341 A | 4/2013 |
| CN | 103062283 A | 4/2013 |
| EP | 1 486 825 A1 | 12/2004 |
| EP | 1803970 A2 | 7/2007 |
| EP | 1803970 B1 | 10/2011 |
| WO | 9922272 A1 | 5/1999 |

OTHER PUBLICATIONS

English Abstract of CN103047341.
English Abstract of CN103032515.
English Abstract of EP1803965.
English Abstract of EP180970.
English Abstract fo EP 1803970 A2 Jul. 4, 2007.

* cited by examiner

VIBRATION ISOLATOR WITH ZERO STIFFNESS WHOSE ANGLE DEGREE OF FREEDOM IS DECOUPLED WITH SPHERICAL AIR BEARING

CROSS-REFERENCE TO RELATED APPLICATION

This U.S. application claims priority under 35 U.S.C 371 to, and is a U.S. National Phase application of, the International Patent Application No. PCT/CN2014/072278, filed 19 Feb. 2014, which claims the benefit of prior Chinese Application No. 201210571692.6 filed 19 Dec. 2012. The entire contents of the above-mentioned patent applications are incorporated by reference as part of the disclosure of this U.S. application.

FIELD OF INVENTION

The present invention relates to a vibration isolator with zero stiffness whose angle degree of freedom is decoupled with a spherical air bearing, which can be used for low frequency and high performance vibration isolation in precision measurement instruments and manufacturing equipments.

DESCRIPTION OF PRIOR ART

With quick development of precision measurement and manufacturing, environmental vibration has become a main factor that limits the precision and performance of precision measuring instruments and manufacturing equipments. For example, step-scan lithography machines are most precise among all kinds of manufacturing equipments, their line width of lithography is up to 22 nm, and their wafer positioning precision and overlay precision are up to several nanometers. Meanwhile, movement speed of their wafer stages is up to 1 m/s, and acceleration is up to dozens of times of gravitational acceleration. For such ultra-precision equipments, precision vibration isolation is a key technology. A very quiet environment should be provided for measuring systems and objective lens, while wafer stages should be moved with high speed and acceleration. 3D nature frequencies of vibration isolation systems should be smaller than 1 Hz. On the other hand, relative position between key parts in a lithography machine, such as the distance between objective lens and wafers should be precisely controlled, control precision of relative position between upper mounting plates and lower mounting plates of vibration isolators should reach 10 μm.

The natural frequency of a passive vibration isolator is proportional to its stiffness, and inversely proportional to its mass. Therefore it is a very efficient way to lower natural frequency of a vibration isolator and improve its performance through reducing its stiffness. However, for a traditional vibration isolator based on air spring, it's very difficult to further reduce its stiffness, especially horizontal stiffness. To solve this problem, researchers introduce a "pendulum" structure in a vibration isolator based on air spring to reduce their lateral stiffness (1. Nikon Corporation. Vibration Isolator with Low Lateral Stiffness. U.S. Patent No.: US20040065517A1; 2. U.S. Philips Corporation. Positioning Device with a Force Actuator System for Compensating Center-of-gravity Displacements, and Lithographic Device Provided with Such A Positioning Device. U.S. Patent No.: US005844664A). With this method, lateral stiffness of a vibration isolator based on air spring can be reduced and its performance can be improved to a certain extent. However, there are following shortcomings: 1) the extent of reducing of horizontal and vertical stiffness is limited by material property and structural stiffness; 2) horizontal and vertical positioning precision of a vibration isolator based on air spring is too low to meet requirement of lithography; 3) a large length of "pendulum" is needed to achieve low horizontal stiffness, being apt to result large height of the vibration isolator, chord-membrane-resonance and poor stability.

It's difficult to meet requirements of low stiffness and high positioning precision in a lithography machine with existing vibration isolators based on air spring. German company IDE presents a new vibration isolator (1. Integrated Dynamics Engineering GmbH. Isolatorgeometrie Eines Schwingungsisolationssystem. European Patent No.: EP1803965A2; 2. Integrated Dynamics Engineering GmbH. Schwingungsisolationssystem Mit Pneumatischem Tiefpassfilter. European Patent No.: EP1803970A2; 3. Integrated Dynamics Engineering GmbH. Air Bearing with Consideration of High-Frequency Resonances. US Patent No.: US20080193061A1). Air bearing surface is introduced to decouple and isolate vertical and horizontal vibration, and very low stiffness and natural frequency can be achieved. However, there are still following shortcomings: 1) high positioning precision can't be achieved with presented design; 2) in patent EP1803965A2, there are no rotary degrees of freedom around horizontal axes between upper and lower mounting plates, so stiffness and natural frequency in that direction are both high, a rubber block is used to provide rotary degrees of freedom around horizontal axes in patents EP1803970A2 and US20080193061A1, however, the angle degree of freedom can't be effectively decoupled due to large angular stiffness of the rubber block.

Netherlandish company ASML has proposed a similar design (1. U.S. Philips Corp, ASM Lithography B.V. Pneumatic Support Device with A Controlled Gas Supply, and Lithographic Device Provided with Such A Support Device. US Patent No.: US006144442A; 2. Koninklijke Philips Electronics N.V., ASM Lithography B.V. Lithographic Pneumatic Support Device with Controlled Gas Supply. International patent publication No.: WO99/22272; 3. ASML Netherlands B.V. Support Device, Lithographic Apparatus, and Device Manufacturing Method Employing A Supporting Device, and A Position Control System Arranged for Use in A Supporting Device. US Patent No.: US007084956B2; 4. ASML Netherlands B.V. Support Device, Lithographic Apparatus, and Device Manufacturing Method Employing A Supporting Device and A Position Control System Arranged for Use in A Supporting Device. European Patent No.: EP1486825A1). The air pressure is close-loop controlled to increase the stability and performance of the vibration isolator in patents US006144442A and WO99/22272. A vibration sensor is mounted on the upper mounting plate and a reference system is introduced as well to improve performance of vibration isolation in patents US007084956B2 and EP1486825A1. However, problems of precision positioning and decoupling of angle degree of freedom between the upper and lower mounting plates are not solved.

SUMMARY OF INVENTION

In order to solve the problem of precision positioning and decoupling of angle degree of freedom between the upper and lower mounting plates, the prevent invention provides a vibration isolator with 3D zero stiffness whose angle degree of freedom is decoupled with a spherical air bearing. And it can be used for high performance vibration isolation in precision measuring instruments and manufacturing equipments, such as step-scan lithography machines.

The present invention provides a vibration isolator with zero stiffness whose angle degree of freedom is decoupled with a spherical air bearing, which comprises a upper mounting plate (1), a lower mounting plate (2), a clean air compressor (3), air pipe (26) and a main body (4), the main body (4) is fitted between the upper mounting plate (1) and the lower mounting plate (2), the clean air compressor (3) is connected to the main body (4) with the air pipe (26); in the main body (4), the lower surface of a downside-down sleeve (6) and the lower mounting plate (2) are lubricated and supported against each other with a planar air bearing surface (21), a upside-down piston cylinder (5) is fitted inside the sleeve (6) and they are lubricated and supported against each other with a cylindrical air bearing surface (22), a spherical air bearing (7) is fitted between the piston cylinder (5) and the upper mounting plate (1), a voice coil motor in Z direction (10), a displacement sensor in Z direction (13) and a limit switch in Z direction (16) are fitted between the piston cylinder (5) and the sleeve (6), a voice coil motor in X direction (8), a displacement sensor in X direction (11) and a limit switch in X direction (14) as well as a voice coil motor in Y direction (9), a displacement sensor in Y direction (12) and a limit switch in Y direction (15) are fitted between the sleeve (6) and the lower mounting plate (2), the direction of driving force of the voice coil motor in Z direction (10) is vertical, while the direction of driving force of the voice coil motor in X direction (8) and voice coil motor in Y direction (9) is horizontal and perpendicular to each other, the sensitive direction of the displacement sensor in X direction (11), the displacement sensor in Y direction (12) and the displacement sensor in Z direction (13) as well as the limit switch in X direction (14), the limit switch in Y direction (15) and the limit switch in Z direction (16) are the same as the direction of driving force of the voice coil motor in X direction (8), the voice coil motor in Y direction (9) and the voice coil motor in Z direction (10) respectively; the displacement sensor in X direction (11), the displacement sensor in Y direction (12) and the displacement sensor in Z direction (13) as well as the limit switch in X direction (14), the limit switch in Y direction (15) and the limit switch in Z direction (16) are connected to signal input terminals of a controller (19), signal output terminals of the controller (19) are connected to signal input terminals of a driver (20), and signal output terminals of the driver (20) are connected to the voice coil motor in X direction (8), the voice coil motor in Y direction (9) and the voice coil motor in Z direction (10) respectively.

Preferably an air pressure sensor (17) is fitted inside the piston cylinder (5), there is an air inlet (23) and an electromagnetic valve (18) in the piston cylinder (5), the air pressure sensor (17) is connected to a signal input terminal of the controller (19), a signal output terminal of the controller (19) is connected to a signal input terminal of the driver (20), a signal output terminal of the driver (20) is connected to the electromagnetic valve (18).

The voice coil motor in X direction (8), the voice coil motor in Y direction (9) and the voice coil motor in Z direction (10) are cylindrical voice coil motors or flat voice coil motors.

The displacement sensor in X direction (11), displacement sensor in Y direction (12) and displacement sensor in Z direction (13) are grating rulers, magnetic grid rulers, capacitive grid rulers or linear potentiometers.

The limit switch in X direction (14), limit switch in Y direction (15) and limit switch in Z direction (16) are mechanical limit switches, hall limit switches or photoelectric limit switches.

Preferably the air pressure inside said piston cylinder (5) is 0.1 MPa~0.8 MPa.

Preferably the thickness of compressed air film of the planar air bearing surface (21) and the cylindrical air bearing surface (22) is 10 μm~20 μm.

The diameter of throttle holes in cylindrical air bearing surface (25) of the piston cylinder (5) and planar air bearing surface (24) of the sleeve (6) is φ0.1 mm~φ1 mm.

The present invention has following advantages:

(1) No fiction, wear and additional stiffness introduced into vibration isolators during decoupling of angle degree of freedom. The present invention introduces a spherical air bearing to decouple the angle degree of freedom between the upper and lower mounting plates, and the problem of friction, wear and introduction of additional stiffness in existing designs and patents during decoupling with elastic body can be successfully solved.

(2) Approximate zero stiffness so that outstanding low frequency vibration isolation performance can be achieved. The present invention employs a planar air bearing surface and a cylindrical air bearing surface to decouple and isolation vibration in horizontal and vertical directions, the difficulty of very low stiffness and contradiction between stiffness and stability in existing designs and patents can be solved.

(3) High positioning precision for control of relative position between upper and lower mounting plates. The present invention employs voice coil motors, displacement sensors, limit switches, a controller and a driver to form position close-loop control systems in vertical and horizontal directions, so that the relative position between upper and lower mounting plates can be precisely controlled to 10 μm. The problem of low positioning precision and contradiction between positioning precision and stiffness in existing design and patents can be solved.

(4) Ideal gravity balance for excellent vertical vibration isolation with zero stiffness. The present invention employs an air pressure sensor, an electromagnetic valve, a controller and a driver to form an air pressure close-loop control system, so that the air pressure inside the sleeve is precisely controlled, and the gravity of vertical load of the vibration isolator can be balanced with high precision.

BRIEF DESCRIPTION OF ACCOMPANYING DRAWINGS

DESCRIPTION OF PREFERRED EMBODIMENTS

Preferred embodiments of the present invention will be described in detail with reference to accompanying drawings.

Figure 1:
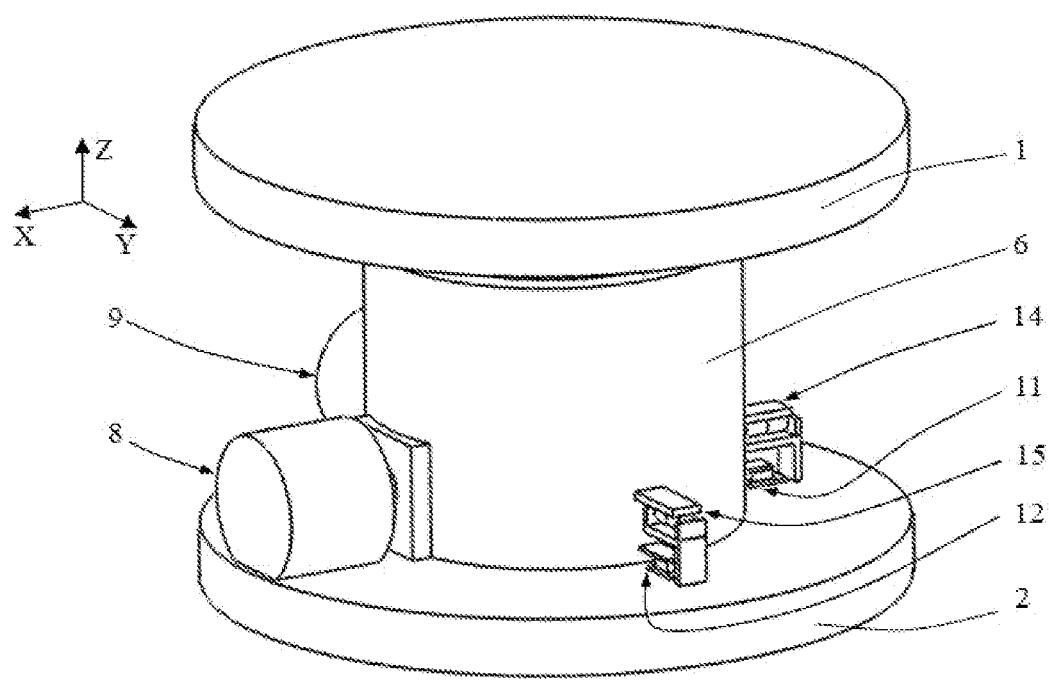
FIG. 1 is a structure diagram of the vibration isolator with zero stiffness whose angle degree of freedom is decoupled with a spherical air bearing.
Figure 2:
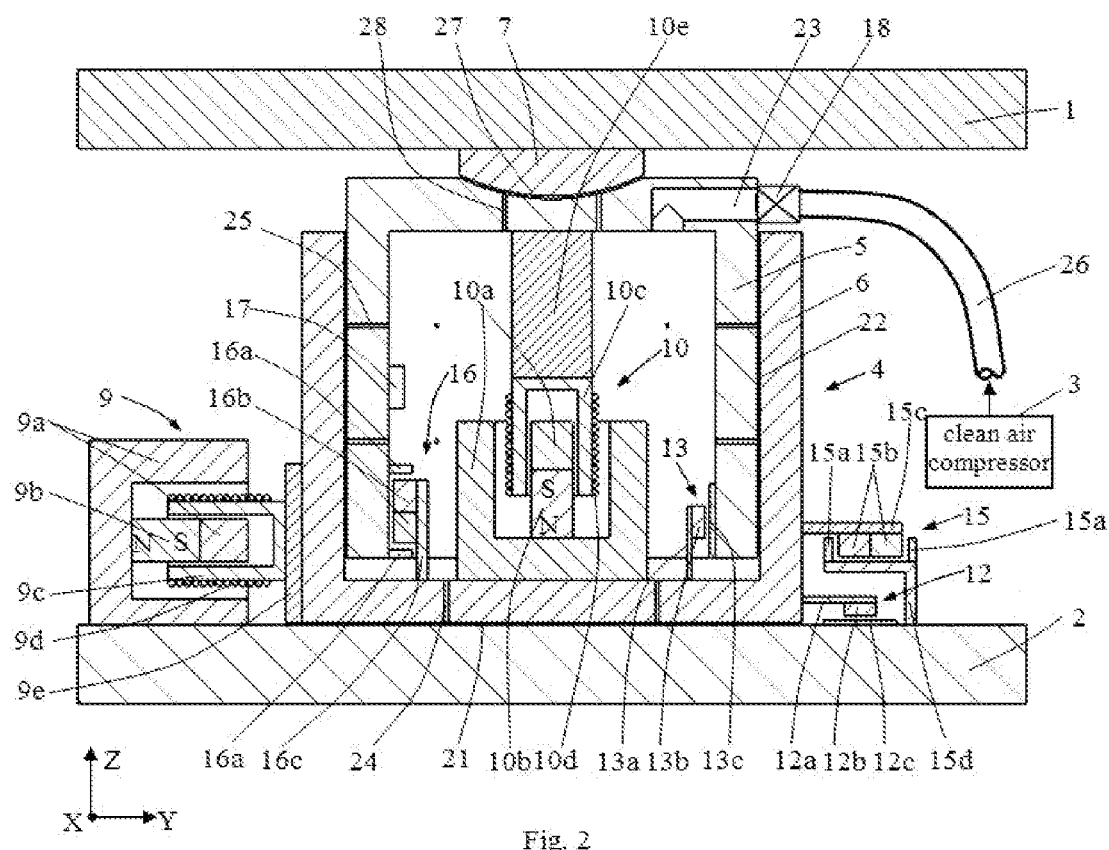
FIG. 2 is a cross-sectional view of the vibration isolator with zero stiffness whose angle degree of freedom is decoupled with a spherical air bearing.
Figure 3:
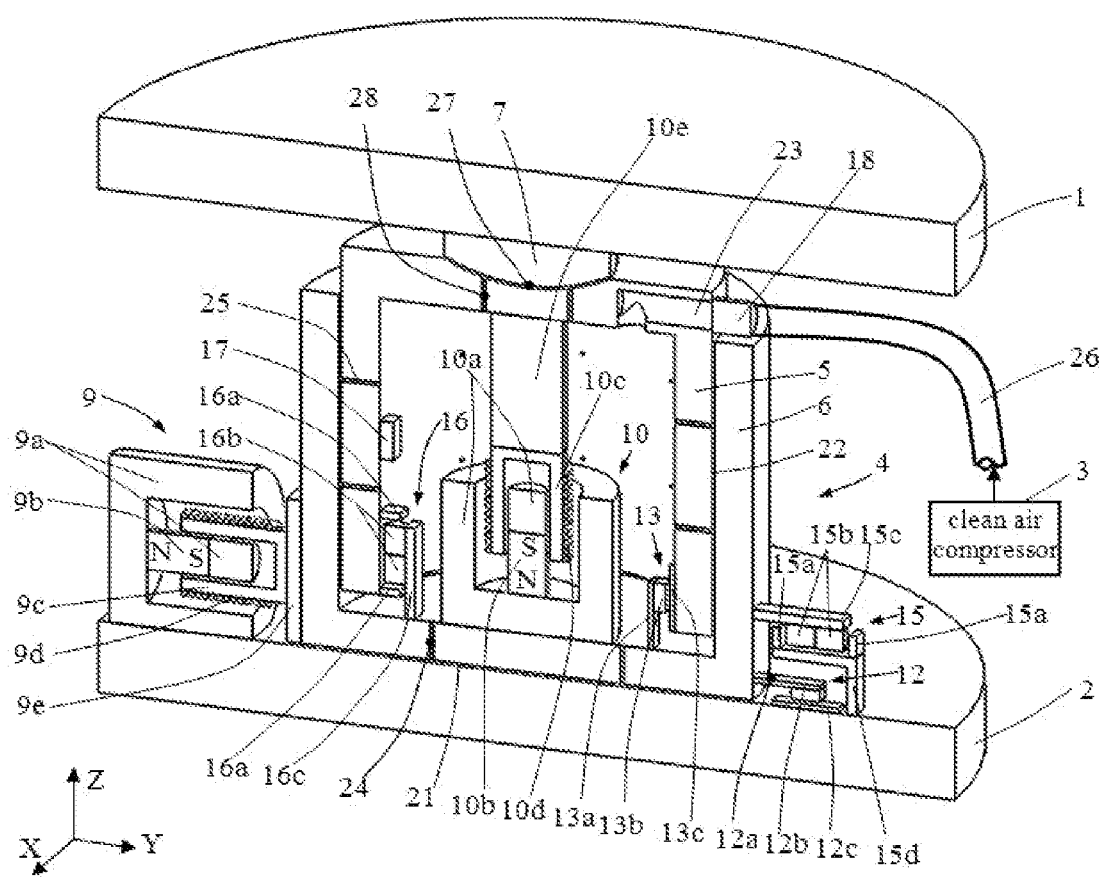
FIG. 3 is a 3D cross-sectional view of the vibration isolator with zero stiffness whose angle degree of freedom is decoupled with a spherical air bearing.
Figure 4:
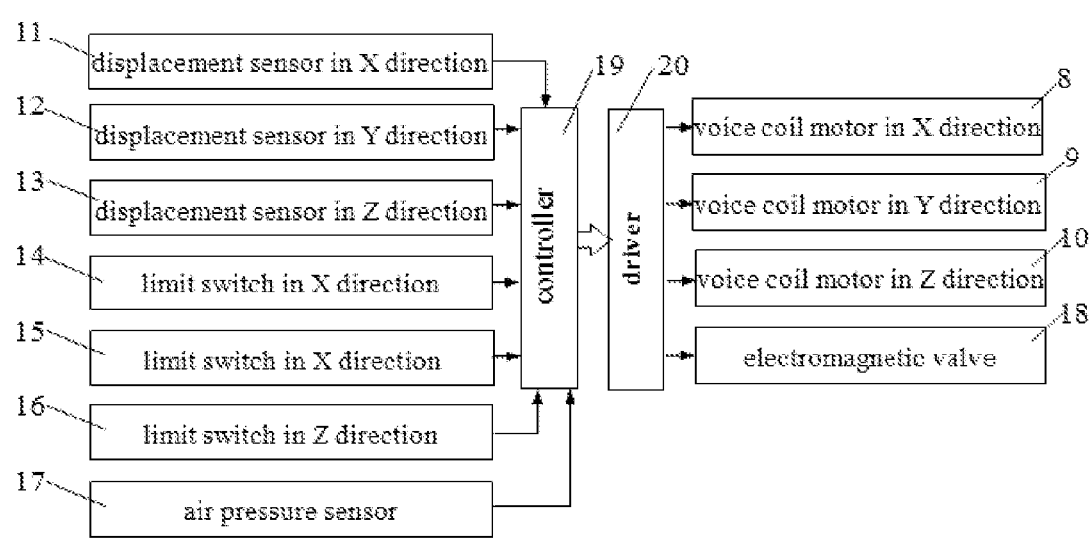
FIG. 4 is a block diagram of control of the vibration isolator with zero stiffness whose angle degree of freedom is decoupled with a spherical air bearing.

As shown in FIG. 1, FIG. 2 and FIG. 3, a vibration isolator with zero stiffness whose angle degree of freedom is decoupled with a spherical air bearing comprises a upper mounting plate 1, a lower mounting plate 2, a clean air compressor 3, an air pipe 26 and a main body 4, the main body 4 is fitted between the upper mounting plate 1 and the lower mounting plate 2, and the clean air compressor 3 is connected to the main body 4 with the air pipe 26; in the main body 4, the lower surface of a downside-down sleeve 6 and the lower mounting plate 2 are lubricated and supported against each other with a planar air bearing surface 21, a upside-down piston cylinder 5 is fitted inside the sleeve 6 and they are lubricated against each other with a cylindrical air bearing surface 22, a spherical air bearing 7 is fitted between the piston cylinder 5 and the upper mounting plate 1, a voice coil motor in Z direction 10, a displacement sensor in Z direction 13 and a limit switch in Z direction 16 are fitted between the piston cylinder 5 and the sleeve 6, a voice coil motor in X direction 8, a displacement sensor in X direction 11 and a limit switch in X direction 14 as well as a voice coil motor in Y direction 9, a displacement sensor in Y direction 12 and a limit switch in Y direction 15 are fitted between the sleeve 6 and the lower mounting plate 2, the direction of driving force of the voice coil motor in Z direction 10 is vertical, while the direction of driving force of the voice coil motor in X direction 8 and voice coil motor in Y direction 9 is horizontal and perpendicular to each other, the sensitive direction of the displacement sensor in X direction 11, the displacement sensor in Y direction 12 and the displacement sensor in Z direction 13 as well as the limit switch in X direction 14, the limit switch in Y direction 15 and the limit switch in Z direction 16 are the same as the direction of driving force of the voice coil motor in X direction 8, the voice coil motor in Y direction 9 and the voice coil motor in Z direction 10 respectively; the displacement sensor in X direction 11, the displacement sensor in Y direction 12 and the displacement sensor in Z direction 13 as well as the limit switch in X direction 14, the limit switch in Y direction 15 and the limit switch in Z direction 16 are connected to signal input terminals of a controller 19, signal output terminals of the controller 19 are connected to signal input terminals of a driver 20, and signal output terminals of the driver 20 are connected to the voice coil motor in X direction 8, the voice coil motor in Y direction 9 and the voice coil motor in Z direction 10 respectively.

Preferably an air pressure sensor 17 is fitted inside the piston cylinder 5, there is an air inlet 23 and an electromagnetic valve 18 in the piston cylinder 5, the air pressure sensor 17 is connected to a signal input terminal of the controller 19, a signal output terminal of the controller 19 is connected to a signal input terminal of the driver 20, a signal output terminal of the driver 20 is connected to the electromagnetic valve 18.

The voice coil motor in X direction 8, the voice coil motor in Y direction 9 and the voice coil motor in Z direction 10 are cylindrical voice coil motors or flat voice coil motors.

The displacement sensor in X direction 11, displacement sensor in Y direction 12 and displacement sensor in Z direction 13 are grating rulers, magnetic grid rulers, capacitive grid rulers or linear potentiometers.

The limit switch in X direction 14, limit switch in Y direction 15 and limit switch in Z direction 16 are mechanical limit switches, Hall limit switches or photoelectric limit switches.

Preferably the air pressure inside said piston cylinder 5 is 0.1 MPa~0.8 MPa.

Preferably the thickness of compressed air film of the planar air bearing surface 21 and the cylindrical air bearing surface 22 is 10 μm~20 μm.

The diameter of throttle holes in cylindrical air bearing surface 25 of the piston cylinder 5 and planar air bearing surface 24 of the sleeve 6 is φ0.1 mm~φ1 mm.

One embodiment of the prevent invention is provided with reference to FIG. 1, FIG. 2 and FIG. 3. In this embodiment, the lower mounting plate 2 is fitted onto the base of measurement instruments or manufacturing equipments, and the upper mounting plate 1 is fitted onto the load to be vibration isolated. The voice coil motor in X direction 8, the voice coil motor in Y direction 9 and the voice coil motor in Z direction 10 are cylindrical voice coil motors. Take the voice coil motor in Y direction 9 for example, it comprises an iron yoke of motor Y 9a, a magnetic block of motor Y 9b, a coil skeleton of motor Y 9c, a coil of motor Y 9d and a mounting piece of motor Y 9e. The iron yoke of motor Y 9a, the magnetic block of motor Y 9b, and the coil skeleton of motor Y 9c are cylindrical, the coil of motor Y 9d is wound around the coil skeleton of motor Y 9c, the mounting piece of motor Y 9e provide a mounting structure for the coil skeleton of motor Y 9c. According to electromagnetic theory, magnitude and direction of driving force which the motor outputs can be precisely controlled by adjusting magnitude and direction of current in the coil.

The spherical air bearing 7 in this embodiment is fitted in such a way: its lower surface is mounted onto the piston cylinder 5, and is lubricated and supported against the piston cylinder 5 with the spherical air bearing surface 27, the upper surface of spherical air bearing 7 is rigidly fitted onto the upper mounting plate 1.

In this embodiment, the displacement sensor in X direction 11, the displacement sensor in Y direction 12 and the displacement sensor in Z direction 13 are grating rulers. Take the displacement sensor in Z direction 13 for example, it comprises a mounting piece of grating Y 13a, a reading head of grating Z 13b and a glass ruler of grating Z 13c. The mounting piece of grating Y 13a provides a mounting structure for the reading head of grating Z 13b. The reading head of grating Z 13b can detect the relative displacement between itself and the glass ruler of grating Z 13c, and then deliver the displacement signal to the controller 19.

In this embodiment, the limit switch in X direction 14, the limit switch in Y direction 15 and the limit switch in Z direction 16 are Hall limit switches. Take the limit switch in Z direction 16 for example, it comprises two limit blocks of switch Z 16a, two Hall switches of switch Z 16b and a mounting piece of switch Z 16c. Two Hall switches of switch Z 16b are fitted back to back against each other. The mounting piece of switch Z 16c provides a mounting structure for two Hall switches of switch Z 16b. When two Hall switches of switch Z 16b are moved close to two limit blocks of switch Z 16a, a limit signal will be generated and delivered to the controller 19.

In this embodiment, the voice coil motor in Z direction 10, the displacement sensor in Z direction 13 and the limit switch in Z direction 16 are all fitted between the piston cylinder 5 and the sleeve 6 and inside the piston cylinder 5.

The load of the presented vibration isolator is supported in such a way: the clean air compressor 3 feeds clean compressed air into the piston cylinder 5 via the air pipe 26, the electromagnetic valve 18 and the air inlet 23. The controller 19 adjusts the open degree of the electromagnetic valve 18 according the feedback signal of the air pressure sensor 17. As a result, the air pressure in the piston cylinder 5 is precisely adjusted so that the upward force applied on the piston cylinder 5 is balanced with load, gravity of the piston cylinder 5 and other parts fitted together with it.

In this embodiment, the pressure of clean compressed air in the piston cylinder 5 is 0.4 Mpa, the effective radius of the lower surface of the piston cylinder 5 is 100 mm, so the mass that a single vibration isolator can support is: $m = p \times \pi r^2 / g \approx 1282$ kg, where p is the air pressure, p=0.4 Mpa, r is the effective radius of the lower surface of the piston cylinder 5, r=100 mm, and g is the gravity acceleration, g=9.8 m/m².

Figure 5:
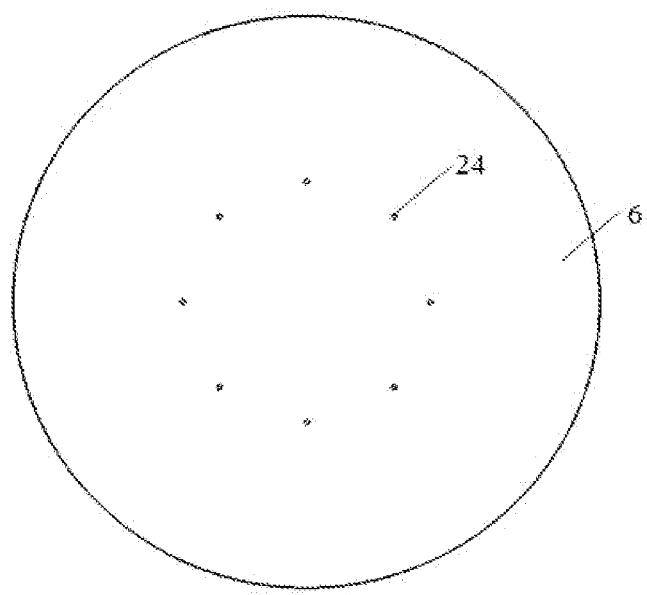
FIG. 5 is one embodiment of throttle holes in the planar air bearing surface of the sleeve.

A preferred embodiment of throttle holes in planar air bearing surface of sleeve 6 is provided with reference to FIG. 5. In this embodiment, 8 throttle holes in planar air bearing surface 24 with diameter of ϕ0.2 mm are uniformly distributed in a circle direction around the center of the lower surface of the sleeve 6.

Figure 6:
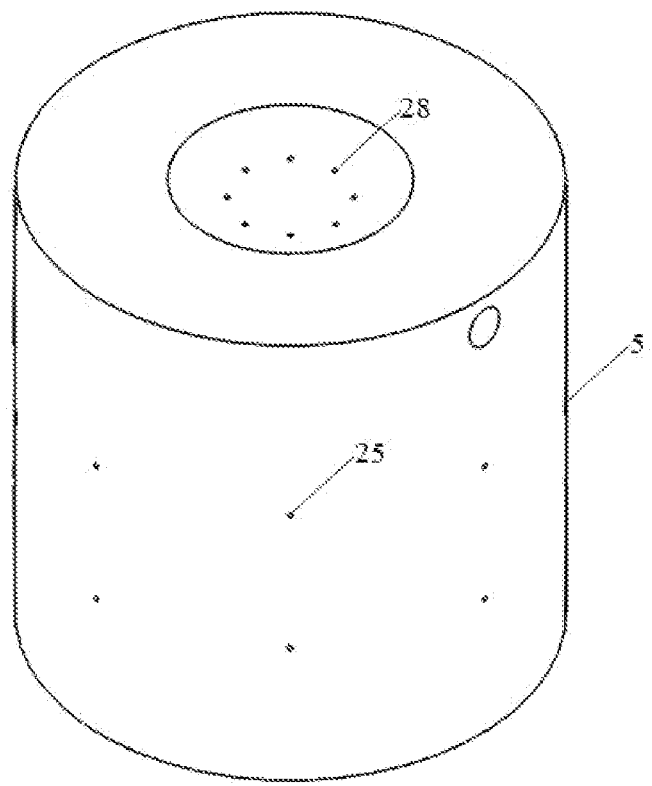
FIG. 6 is one embodiment of throttle holes in the cylindrical air bearing surface and the spherical air bearing surface of the piston cylinder.

A preferred embodiment of throttle holes in cylindrical air bearing surface and spherical air bearing surface of the piston cylinder 5 is provided with reference to FIG. 6. In this embodiment, two rows of throttle holes in cylindrical air bearing surface 25 of piston cylinder 5 are uniformly distributed in a circle direction in the side wall of the piston cylinder 5. There are 8 throttle holes with diameter of ϕ0.2 mm in each row. Throttle holes in spherical air bearing surface 28 with diameter of ϕ0.2 mm are uniformly distributed in a circle direction around the center of the upper surface of the piston cylinder 5.

In the accompanying drawings:

| | |
|---|---|
| upper mounting plate | 1 |
| lower mounting plate | 2 |
| clean air compressor | 3 |
| main body | 4 |
| piston cylinder | 5 |
| sleeve | 6 |
| spherical air bearing | 7 |
| voice coil motor in X direction | 8 |
| voice coil motor in Y direction | 9 |
| iron yoke of motor Y | 9a |
| magnetic block of motor Y | 9b |
| coil skeleton of motor Y | 9c |
| coil of motor Y | 9d |
| mounting piece of motor Y | 9e |
| voice coil motor in Z direction | 10 |
| iron yoke of motor Z | 10a |
| magnetic block of motor Z | 10b |
| coil skeleton of motor Z | 10c |
| coil of motor Z | 10d |
| mounting piece of motor Z | 10e |
| displacement sensor in X direction | 11 |
| displacement sensor in Y direction | 12 |
| mounting piece of grating Y | 12a |
| reading head of grating Y | 12b |
| glass ruler of grating Y | 12c |
| displacement sensor in Z direction | 13 |
| mounting piece of grating Y | 13a |
| reading head of grating Z | 13b |
| glass ruler of grating Z | 13c |
| limit switch in X direction | 14 |
| limit switch in Y direction | 15 |
| limit block of switch Y | 15a |
| Hall switch of switch Y | 15b |
| mounting piece of switch Y | 15c |
| mounting piece of limit Y | 15d |
| limit switch in Z direction | 16 |
| limit block of switch Z | 16a |
| Hall switch of switch Z | 16b |
| mounting piece of switch Z | 16c |
| air pressure sensor | 17 |
| electromagnetic valve | 18 |
| controller | 19 |
| driver | 20 |
| planar air bearing surface | 21 |
| cylindrical air bearing surface | 22 |
| air inlet | 23 |
| throttle hole in planar air bearing surface | 24 |
| throttle hole in cylindrical air bearing surface | 25 |
| air pipe | 26 |
| spherical air bearing surface | 27 |
| throttle hole in spherical air bearing surface | 28 |

The invention claimed is:

1. A vibration isolator with zero stiffness, comprising
a upper mounting plate (1),
a lower mounting plate (2),
a main body (4) fitted between the upper mounting plate (1) and the lower mounting plate (2), and
a clean air compressor (3) connected to the main body (4) through an air pipe (26);
wherein the main body (4) comprising
a downside-down sleeve (6) lubricated and supported against the lower mounting plate (2) by a planar air bearing surface (21),
a upside-down piston cylinder (5) fitted in the sleeve (6) and lubricated and supported against the sleeve (6) by a cylindrical air bearing surface (22);
a spherical air bearing (7) fitted between the piston cylinder (5) and the upper mounting plate (1);
a voice coil motor in a vertical or Z direction (10) for providing a vertical driving force, a displacement sensor in Z direction (13) and a limit switch in Z direction (16) having respective sensitive directions along the direction of the vertical driving force that are fitted between the piston cylinder (5) and the sleeve (6);
a voice coil motor in a first horizontal or X direction (8) for providing a first horizontal driving force, a displacement sensor in X direction (11) and a limit switch in X direction (14) having respective sensitive directions along the direction of the first horizontal driving force that are fitted between a sleeve cylinder (6) and the lower mounting plate (2);
a voice coil motor in a second horizontal or Y direction (9) for providing a second horizontal driving force perpendicular to the first horizontal driving force, a displacement sensor in Y direction (12) and a limit switch in Y direction (15) having respective sensitive directions along the direction of the second horizontal driving force that are fitted between the sleeve cylinder (6) and the lower mounting plate (2);
a controller (19) having signal input terminals connected to the displacement sensor in X direction (11), the displacement sensor in Y direction (12) and the displacement sensor in Z direction (13) as well as the limit switch in X direction (14), the limit switch in Y direction (15) and the limit switch in Z direction (16) and signal output terminals;
a driver (20) having signal input terminals connected to the signal output terminals of the controller (19) and signal output terminals connected to the voice coil motor in X direction (8), the voice coil motor in Y direction (9) and the voice coil motor in Z direction (10) respectively, wherein an air pressure sensor (17) is fitted inside the piston cylinder (5) which is connected to a signal input terminal of the controller (19), a signal output terminal of the controller (19) is connected to a signal input terminal of the driver (20), a signal output terminal of the driver (20) is connected to an electromagnetic valve (18) fitted in the piston cylinder (5).

2. A vibration isolator with zero stiffness according to claim 1, wherein the voice coil motor in X direction (8), the voice coil motor in Y direction (9) and the voice coil motor in Z direction (10) are cylindrical voice coil motors or flat voice coil motors.

3. A vibration isolator with zero stiffness according to claim 1, wherein the limit switch in X direction (14), the limit switch in Y direction (15) and the limit switch in Z direction (16) are mechanical limit switches, hall limit switches or photoelectric limit switches.

4. A vibration isolator with zero stiffness according to claim 1, wherein the air pressure inside the piston cylinder (5) is within the range of 0.1 MPa~0.8 MPa.

5. A vibration isolator with zero stiffness according to claim 1, wherein the planar air bearing surface (21) and the cylindrical air bearing surface (22) is each provided with a compressed air film with thickness of 10 μm~20 μm.

6. A vibration isolator with zero stiffness according to claim 1, wherein the cylindrical air bearing surface (22) of the piston cylinder (5) and planar air bearing surface (24) of the sleeve (6) having a plurality of throttle holes with diameter within a range of ϕ0.1 mm~ϕ1 mm.

\* \* \* \* \*